(12) United States Patent
Izumi et al.

(10) Patent No.: US 11,307,257 B2
(45) Date of Patent: Apr. 19, 2022

(54) BATTERY INFORMATION PROCESSING SYSTEM, METHOD OF ESTIMATING CAPACITY OF SECONDARY BATTERY, AND BATTERY ASSEMBLY AND METHOD OF MANUFACTURING BATTERY ASSEMBLY

(71) Applicant: TOYOTA JIDOSHA KABUSHIKI KAISHA, Toyota (JP)

(72) Inventors: Junta Izumi, Nagoya (JP); Masahiko Mitsui, Toyota (JP); Juni Yasoshima, Toyota (JP); Kotaro Shibuya, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 447 days.

(21) Appl. No.: 16/519,138

(22) Filed: Jul. 23, 2019

(65) Prior Publication Data
US 2020/0041570 A1 Feb. 6, 2020

(30) Foreign Application Priority Data
Jul. 31, 2018 (JP) .............................. JP2018-143584

(51) Int. Cl.
*G01R 31/367* (2019.01)
*G06N 3/04* (2006.01)
(Continued)

(52) U.S. Cl.
CPC ......... *G01R 31/367* (2019.01); *G01R 31/387* (2019.01); *G06N 3/04* (2013.01); *G06N 3/08* (2013.01)

(58) Field of Classification Search
CPC .. G01R 31/367; G01R 31/387; G01R 31/389; G01R 31/3865; G01R 31/385;
(Continued)

(56) References Cited

U.S. PATENT DOCUMENTS

2003/0184307 A1\* 10/2003 Kozlowski .......... H01M 6/5044
324/427
2012/0271578 A1 10/2012 Nareid
(Continued)

FOREIGN PATENT DOCUMENTS

CN 103091642 A 5/2013
CN 107076801 A 8/2017
(Continued)

OTHER PUBLICATIONS

Hanif et al. , Determining Battery SoC Using Electrochemical Impedance Spectroscopy and the Extreme Learning Machine, IEEE, (Year: 2015).\*

(Continued)

*Primary Examiner* — Mohammad K Islam
(74) *Attorney, Agent, or Firm* — Sughrue Mion, PLLC

(57) ABSTRACT

A trained neural network model is a neural network model which has been trained based on Nyquist plots of a plurality of modules of which full charge capacity is within a reference range. A processing system determines to which of a first group of modules of which full charge capacity is within the reference range and a second group of modules of which full charge capacity is out of the reference range a module belongs, based on discriminant analysis in which at least one feature value extracted from the Nyquist plot of the module is adopted as an explanatory variable. When the processing system determines that the module M belongs to the first group, the processing system estimates a full charge capacity of the module by using the trained neural network model.

8 Claims, 12 Drawing Sheets

(51) Int. Cl.
*G06N 3/08* (2006.01)
*G01R 31/387* (2019.01)

(58) Field of Classification Search
CPC .......... G01R 31/396; G06N 3/04; G06N 3/08;
G06N 3/0454; Y02W 30/84; Y02E 60/10;
H01M 10/4285; H01M 10/54
See application file for complete search history.

(56) References Cited

U.S. PATENT DOCUMENTS

| | | |
|---|---|---|
| 2014/0358462 A1 | 12/2014 | Christophersen et al. |
| 2017/0219660 A1 | 8/2017 | Christensen et al. |
| 2017/0249534 A1 | 8/2017 | Townsend et al. |
| 2019/0120910 A1* | 4/2019 | Ghantous ............. G01R 31/392 |
| 2020/0033414 A1 | 1/2020 | Izumi et al. |

FOREIGN PATENT DOCUMENTS

| | | |
|---|---|---|
| JP | 04-123191 A | 4/1992 |
| JP | 2003-317810 A | 11/2003 |
| JP | 2017-157213 A | 9/2017 |
| JP | 2018-18354 A | 2/2018 |

OTHER PUBLICATIONS

Office Action dated Mar. 4, 2021 issued in U.S. Appl. No. 16/511,212.
U.S. Appl. No. 16/511,212, filed Jul. 15, 2019.
Office Action dated Sep. 9, 2021 in U.S. Appl. No. 16/511,212.

\* cited by examiner

BATTERY INFORMATION PROCESSING SYSTEM, METHOD OF ESTIMATING CAPACITY OF SECONDARY BATTERY, AND BATTERY ASSEMBLY AND METHOD OF MANUFACTURING BATTERY ASSEMBLY

This nonprovisional application is based on Japanese Patent Application No. 2018-143584 filed with the Japan Patent Office on Jul. 31, 2018, the entire contents of which are hereby incorporated by reference.

BACKGROUND

Field

The present disclosure relates to a battery information processing system, a method of estimating a capacity of a secondary battery, as well as a battery assembly and a method of manufacturing the battery assembly, and more particularly to an information processing technique for estimating a full charge capacity of a secondary battery.

Description of the Background Art

Electrically powered vehicles incorporating battery assemblies (hybrid vehicles or electric vehicles) have increasingly been used in recent years. Battery assemblies mounted on vehicles are collected on the occasion of replacement purchase of these electrically powered vehicles. The number of collected battery assemblies is expected to rapidly increase in the future.

In general, a battery assembly may deteriorate with lapse of time or with repeated charging and discharging, and a degree of progress of deterioration is different for each collected battery assembly. Therefore, it has been required to evaluate characteristics (a full charge capacity or the like) reflecting a degree of progress of deterioration of each of the collected battery assemblies and to recycle the battery assemblies in accordance with results of evaluation.

An alternating-current (AC) impedance measurement method has been known as an approach to evaluation of characteristics of a secondary battery. For example, Japanese Patent Laying-Open No. 2003-317810 discloses a method of determining whether or not minor short-circuiting has occurred in a secondary battery based on a reaction resistance value of the secondary battery obtained by the AC impedance measurement method.

SUMMARY

A full charge capacity of a secondary battery represents a particularly important characteristic among characteristics reflecting a degree of progress of deterioration of the secondary battery. For example, in a battery assembly to be mounted on a vehicle, a full charge capacity of the battery assembly greatly affects a traveling distance of an electrically powered vehicle.

In general, a battery assembly to be mounted on a vehicle includes a plurality of (for example, several to more than ten) modules and each of the plurality of modules includes a plurality of (for example, several ten) cells. In estimating a full charge capacity of such a battery assembly, a procedure as below may be performed. A plurality of modules are taken out of a collected battery assembly and an AC impedance is measured for each module. Then, the full charge capacity of the module is estimated based on a result of measurement of the AC impedance of each module.

In addition, whether or not the module is recyclable or a manner of recycle (an application) may be determined based on a result of estimation of the full charge capacity of the module.

In the AC impedance measurement method, an AC signal at a frequency within a prescribed range is successively applied to a secondary battery and a response signal from the secondary battery at that time is measured. A real number component and an imaginary number component of an impedance of the secondary battery are calculated from the applied AC signal (an application signal) and the measured response signal, and results of calculation are discretely plotted on a complex plane. This complex impedance plot is also called a Nyquist plot.

By analyzing the Nyquist plot, the full charge capacity of the secondary battery can be estimated. Though details will be described later, various approaches are possible as an approach to analysis of a Nyquist plot, and a possible approach to estimation of a full charge capacity of a secondary battery as accurate as possible is desirably adopted.

The present disclosure was made to solve the problems above, and an object thereof is to improve accuracy in estimation of a full charge capacity of a secondary battery in a battery information system or a method of estimating a capacity of a secondary battery. Another object of the present disclosure is to provide a battery assembly including a battery of which full charge capacity has highly accurately been estimated and a method of manufacturing the same.

(1) A battery information processing system according to one aspect of the present disclosure includes a storage configured to store a trained neural network model and an estimation device configured to estimate a full charge capacity of a target secondary battery from a Nyquist plot showing a result of measurement of an AC impedance of the secondary battery by using the trained neural network model. The trained neural network model is a neural network model which has been trained based on Nyquist plots of a plurality of secondary batteries of which full charge capacity is within a reference range. The estimation device is configured to determine to which of a first group and a second group the target secondary battery belongs based on discriminant analysis, the discriminant analysis adopting at least one feature value extracted from the Nyquist plot of the target secondary battery as an explanatory variable, the first group being defined as a group of secondary batteries of which full charge capacity is within the reference range, the second group being defined as a group of secondary batteries of which full charge capacity is out of the reference range. The estimation device is configured to estimate a full charge capacity of the target secondary battery by using the trained neural network model when it determines that the target secondary battery belongs to the first group.

(2) The trained neural network model is a neural network model which has been trained based on Nyquist plots of a plurality of secondary batteries of which full charge capacity is higher than a reference capacity representing a lower limit value of the reference range. The first group is defined as a group of secondary batteries of which full charge capacity is higher than the reference capacity. The second group is defined as a group of secondary batteries of which full charge capacity is lower than the reference capacity.

(3) The at least one feature value includes an imaginary number component of an AC impedance at a prescribed frequency included in a linear portion, of a semicircular portion and the linear portion of the Nyquist plot of the target secondary battery, and a slope of the linear portion.

(4) The neural network model includes an input layer given a numeric value for each pixel of an image in which the Nyquist plot of the secondary battery is drawn in a region consisting of a predetermined number of pixels. The predetermined number of pixels is greater than a sum of the number of real number components and the number of imaginary number components both representing the result of measurement of the AC impedance of the secondary battery.

(5) The Nyquist plot of the target secondary battery includes a result of measurement of the AC impedance when a frequency of an applied AC signal is within a frequency range not lower than 100 mHz and not higher than 1 kHz.

According to the features in (1) to (5), to which of the first group and the second group a target secondary battery belongs is determined based on discriminant analysis of the target secondary battery. When the target secondary battery is determined to belong to the first group, a full charge capacity of the target secondary battery is more specifically estimated by using the trained neural network model. The trained neural network model has been trained by using only a Nyquist plot of a secondary battery belonging to the first group, and a Nyquist plot of a secondary battery belonging to the second group was not used for training. Therefore, as compared with an example in which both of a Nyquist plot of a secondary battery belonging to the first group and a Nyquist plot of a secondary battery belonging to the second group are used for training, it can be concluded that optimization to estimation of a full charge capacity of the secondary battery belonging to the first group has been made. Therefore, according to the features in (1) to (5), a full charge capacity of a secondary battery can highly accurately be estimated.

(6) A battery assembly according to yet another aspect of the present disclosure includes a plurality of the secondary batteries of which full charge capacity has been estimated by the battery information processing system described above.

According to the feature in (6), a battery assembly including a secondary battery of which full charge capacity has highly accurately been estimated by the battery information system can be provided.

(7) In a method of estimating a capacity of a secondary battery according to still another aspect of the present disclosure, a full charge capacity of a target secondary battery is estimated. The method of estimating a full charge capacity of a secondary battery includes first to fourth steps. The first step is a step of obtaining a Nyquist plot showing a result of measurement of an AC impedance of a target secondary battery. The second step is a step of estimating a full charge capacity of the target secondary battery from the result of measurement of the AC impedance of the target secondary battery by using a trained neural network model. The trained neural network model is a neural network model which has been trained based on Nyquist plots of a plurality of secondary batteries of which full charge capacity is within a reference range. The third step is a step of determining to which of a first group and a second group the target secondary battery belongs based on discriminant analysis, the discriminant analysis adopting a feature value extracted from the Nyquist plot of the target secondary battery as an explanatory variable, the first group being defined as a group of secondary batteries of which full charge capacity is within the reference range, the second group being defined as a group of secondary batteries of which full charge capacity is out of the reference range. The fourth step is a step of estimating a full charge capacity of the target secondary battery by using the trained neural network model when it is determined that the target secondary battery belongs to the first group.

According to the method in (7), as in the features in (1), accuracy in estimation of a full charge capacity of a secondary battery can be improved.

(8) A method of manufacturing a battery assembly according to still another aspect of the present disclosure includes first to fifth steps. The first step is a step of obtaining a result of measurement of an AC impedance of a target secondary battery. The second step is a step of estimating a full charge capacity of the target secondary battery from the result of measurement of the AC impedance of the target secondary battery by using a trained neural network model. The trained neural network model is a neural network model which has been trained based on a Nyquist plot showing a result of measurement of an AC impedance of a secondary battery of which full charge capacity is within a reference range. The third step is a step of determining to which of a first group and a second group the target secondary battery belongs based on discriminant analysis, the discriminant analysis adopting a feature value extracted from the Nyquist plot of the target secondary battery as an explanatory variable, the first group being defined as a group of secondary batteries of which full charge capacity is within the reference range, the second group being defined as a group of secondary batteries of which full charge capacity is out of the reference range. The fourth step is a step of estimating a full charge capacity of the target secondary battery by using the trained neural network model when it is determined that the target secondary battery belongs to the first group. The fifth step is a step of manufacturing a battery assembly from a plurality of the target secondary batteries of which full charge capacity has been estimated in the estimating a full charge capacity (the fourth step).

According to the method in (7), as in the feature in (5), a battery assembly including a secondary battery of which full charge capacity has highly accurately been estimated can be manufactured.

The foregoing and other objects, features, aspects and advantages of the present disclosure will become more apparent from the following detailed description of the present disclosure when taken in conjunction with the accompanying drawings.

DESCRIPTION OF THE PREFERRED EMBODIMENTS

Figure 1:
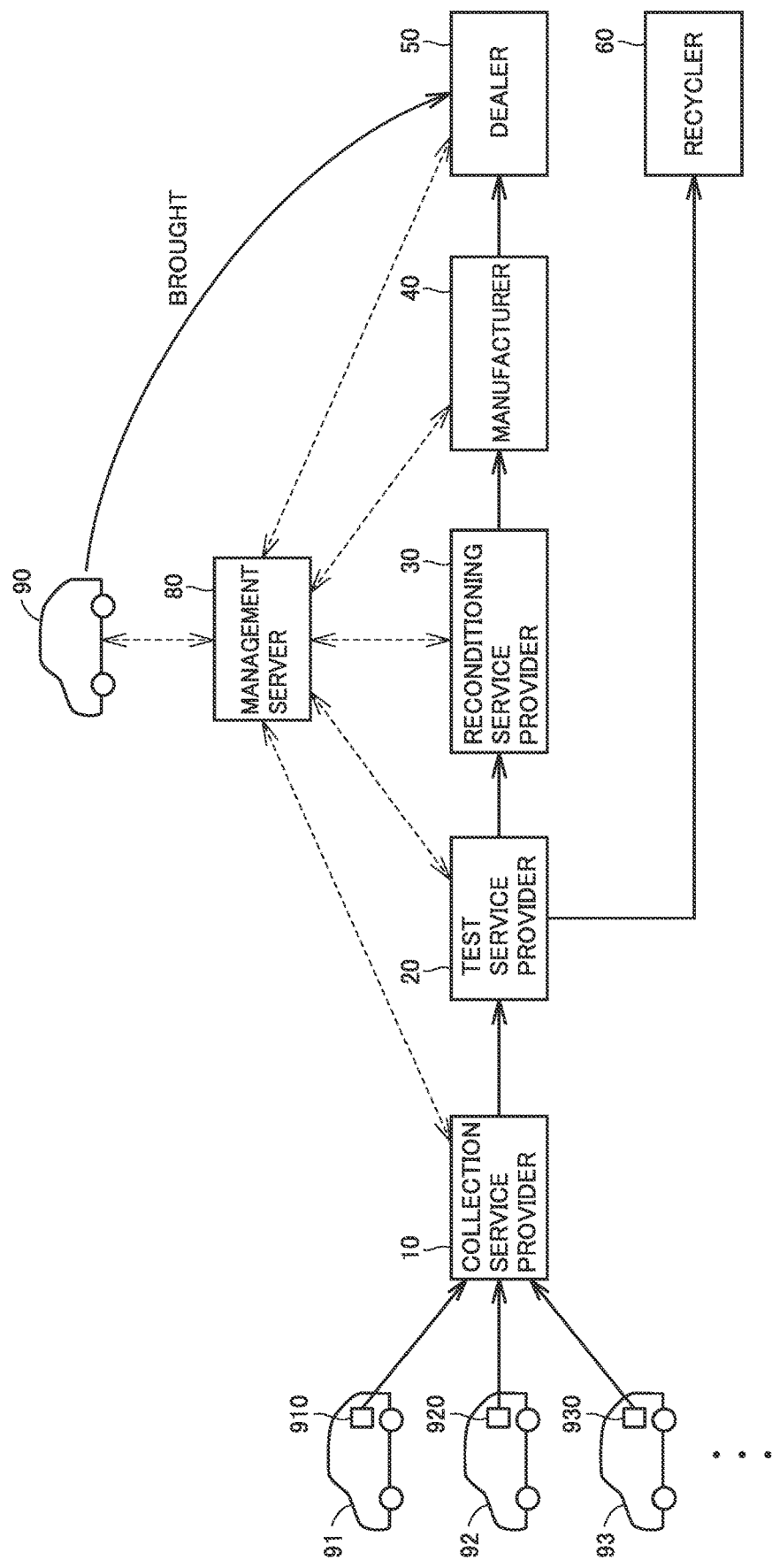
FIG. 1 is a diagram showing one manner of distribution from collection to manufacturing and sales of battery assemblies in the present embodiment.

An embodiment of the present disclosure will be described below in detail with reference to the drawings. The same or corresponding elements in the drawings have the same reference characters allotted and description thereof will not be repeated.

In the present disclosure, a battery assembly includes a plurality of modules (or also called blocks). The plurality of modules may be connected in series or in parallel. Each of the plurality of modules includes a plurality of cells (unit cells) connected in series.

"Manufacturing" of a battery assembly in the present disclosure means manufacturing of a battery assembly by replacing at least one of a plurality of modules included in a battery assembly with other modules (replacement modules). Though the replacement module is basically a recyclable module taken out of a collected battery assembly, it may be a new module.

In general, "recycle" of a battery assembly is broadly categorized into reuse, rebuild, and resource recycle. In the case of reuse, collected battery assemblies are subjected to necessary shipment inspection and shipped as they are as reuse products. In the case of rebuild, collected battery assemblies are once disassembled to modules (which may be cells). Then, among the disassembled modules, modules which can be used after reconditioning (which may be modules which can be used as they are) are combined to manufacture a new battery assembly. Newly manufactured battery assemblies are subjected to shipment inspection and shipped as rebuilt products. In resource recycle, renewable materials are taken out of each cell and hence collected battery assemblies are not used as other battery assemblies.

In the embodiment described below, a battery assembly collected from a vehicle is once disassembled into modules and a performance test is conducted for each module. A battery assembly is manufactured from modules determined as being recyclable as a result of the performance test. Therefore, a recyclable module means a rebuildable module below. Depending on a configuration of a battery assembly, however, a battery assembly as it is can also be subjected to the performance test without being disassembled into modules. "Recycle" in such a case may encompass both of reuse and rebuild.

In the present embodiment, each cell is implemented by a nickel metal hydride battery. More specifically, a positive electrode is composed of nickel hydroxide ($Ni(OH)_2$) to which a cobalt oxide additive is added. A negative electrode is composed of a hydrogen storage alloy (based on MnNi5 which represents a nickel-based alloy). An electrolyte solution is composed of potassium hydroxide (KOH). These, however, are merely by way of example of a specific cell configuration, and a cell configuration to which the present disclosure is applicable is not limited thereto.

Embodiment

<Battery Distribution Model>

Figure 2:
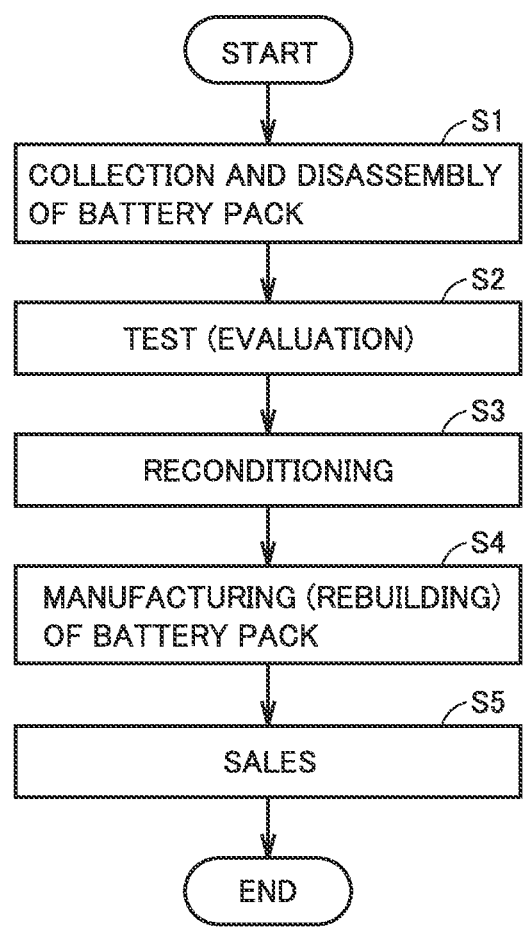
FIG. 2 is a flowchart showing a flow of processing in a battery distribution model shown in FIG. 1.

FIG. 1 is a diagram showing one manner of distribution from collection to manufacturing and sales of battery assemblies in the present embodiment. A manner of distribution shown in FIG. 1 is referred to as a "battery distribution model" below. FIG. 2 is a flowchart showing a flow of processing in the battery distribution model shown in FIG. 1.

Referring to FIGS. 1 and 2, in the battery distribution model, used battery assemblies are collected from a plurality of vehicles each incorporating battery assemblies, and battery assemblies are manufactured from recyclable modules included in the collected battery assemblies and then sold. A battery assembly mounted on a vehicle 90 of a certain user is replaced.

A collection service provider 10 collects used battery assemblies from vehicles 91 to 93. Battery assemblies 910 to 930 are mounted on vehicles 91 to 93, respectively. Though FIG. 1 shows only three vehicles due to space restriction, battery assemblies are actually collected from a larger number of vehicles. Collection service provider 10 disassembles the collected battery assemblies and takes out a plurality of modules from the battery assemblies (step S1, hereinafter the step being abbreviated as "S").

In this battery distribution model, identification information (ID) for identifying a module is provided for each module, and a management server 80 manages information on each module. Therefore, collection service provider 10 transmits an ID of each module taken out of a battery assembly to management server 80 through a terminal device 71 (see FIG. 3).

A test service provider 20 tests performance of each module collected by collection service provider 10 (S2). Specifically, test service provider 20 tests characteristics of the collected module. For example, test service provider 20 tests such electrical characteristics as a full charge capacity, a resistance value, an open circuit voltage (OCV), and a state of charge (SOC). Then, test service provider 20 classifies the modules into recyclable modules and non-recyclable modules based on results of the test, passes the recyclable modules to a reconditioning service provider 30 and the non-recyclable modules to a recycler 60. A test result of each module is transmitted to management server 80 through a terminal device 72 (see FIG. 3) of test service provider 20.

Reconditioning service provider 30 performs a process for reconditioning the module determined as recyclable by test service provider 20 (S3). By way of example, reconditioning service provider 30 restores a full charge capacity of the module by charging the module to an overcharged state. For a module determined as less in lowering in performance in the test by test service provider 20, the reconditioning process performed by reconditioning service provider 30 may be skipped. A result of reconditioning of each module is transmitted to management server 80 through a terminal device 73 (see FIG. 3) of reconditioning service provider 30.

A manufacturer 40 manufactures a battery assembly from modules reconditioned by reconditioning service provider 30 (S4). In the present embodiment, information (assembly information) for manufacturing a battery assembly is generated by management server 80 and transmitted to a terminal device 74 (see FIG. 3) of manufacturer 40. Manufacturer 40 manufactures (rebuilds) a battery assembly of vehicle 90 by replacing a module included in the battery assembly of vehicle 90 in accordance with the assembly information.

A dealer 50 sells the battery assembly manufactured by manufacturer 40 for vehicle use or for stationary use in a house or the like (S5). In the present embodiment, vehicle 90 is brought to dealer 50 and dealer 50 replaces the battery assembly of vehicle 90 with a reuse product or a rebuilt product manufactured by manufacturer 40.

Recycler 60 disassembles modules determined as being non-recyclable by test service provider 20 for reclamation for use as new cells or as source materials for other products.

Though collection service provider 10, test service provider 20, reconditioning service provider 30, manufacturer 40, and dealer 50 are service providers different from one another in FIG. 1, classification of the service providers is not limited as such. For example, a single service provider may serve as test service provider 20 and reconditioning service provider 30. Alternatively, collection service provider 10 may be divided into a service provider which collects battery assemblies and a service provider which disassembles collected battery assemblies. Locations of each service provider and each dealer are not particularly limited. Locations of each service provider and each dealer may be different or a plurality of service providers or dealers may be located at the same place.

Figure 3:
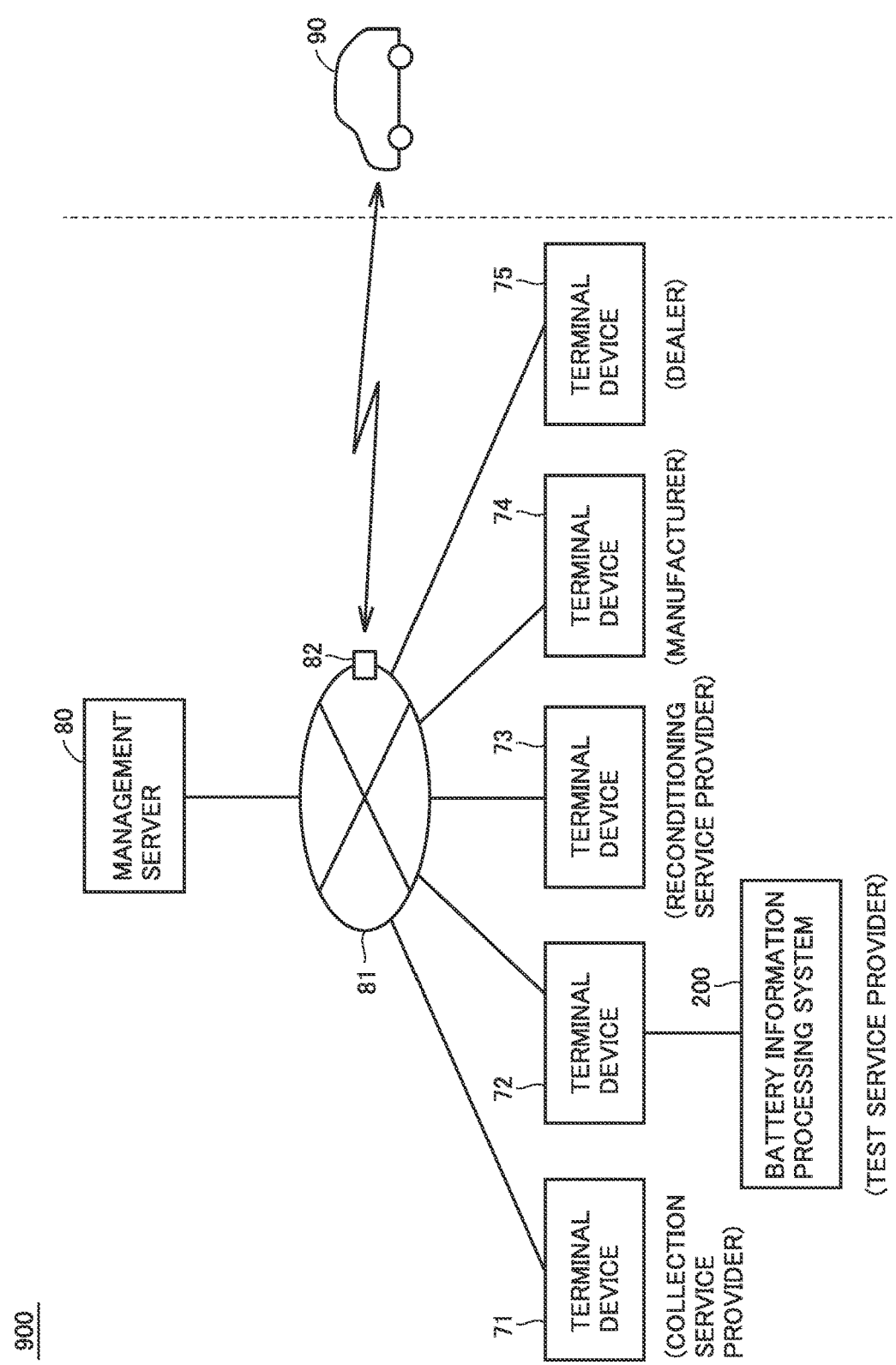
FIG. 3 is a diagram showing an exemplary configuration of a battery management system applied to the battery distribution model shown in FIG. 1.

FIG. 3 is a diagram showing an exemplary configuration of a battery management system applied to the battery distribution model shown in FIG. 1. Referring to FIG. 3, a battery management system 100 includes terminal devices 71 to 75, management server 80, a communication network 81, and a base station 82.

Terminal device 71 is a terminal device of collection service provider 10. Terminal device 72 is a terminal device of test service provider 20. Terminal device 73 is a terminal device of reconditioning service provider 30. Terminal device 74 is a terminal device of manufacturer 40. Terminal device 75 is a terminal device of dealer 50.

Management server 80 and terminal devices 71 to 75 are configured to communicate with one another through communication network 81 such as the Internet or telephone lines. Base station 82 on communication network 81 is configured to be able to transmit and receive information to and from vehicle 90 through wireless communication.

In test service provider 20, a battery information system (which may be abbreviated as a "processing system" below) 200 for measuring an AC impedance of each module and determining a manner of recycle (rebuild or resource recycle) of the module based on a result of measurement is provided. The manner of recycle of the module determined by processing system 200 is transmitted to management server 80, for example, through terminal device 72.

A full charge capacity of a certain module (which is denoted as a "module M" below) among a plurality of modules included in battery assembly 910 taken out of vehicle 91 is estimated by processing system 200 below. A manner of recycle of module M is further determined based on a result of estimation of the full charge capacity of module M.

<Configuration of Battery Information System>

Figure 4:
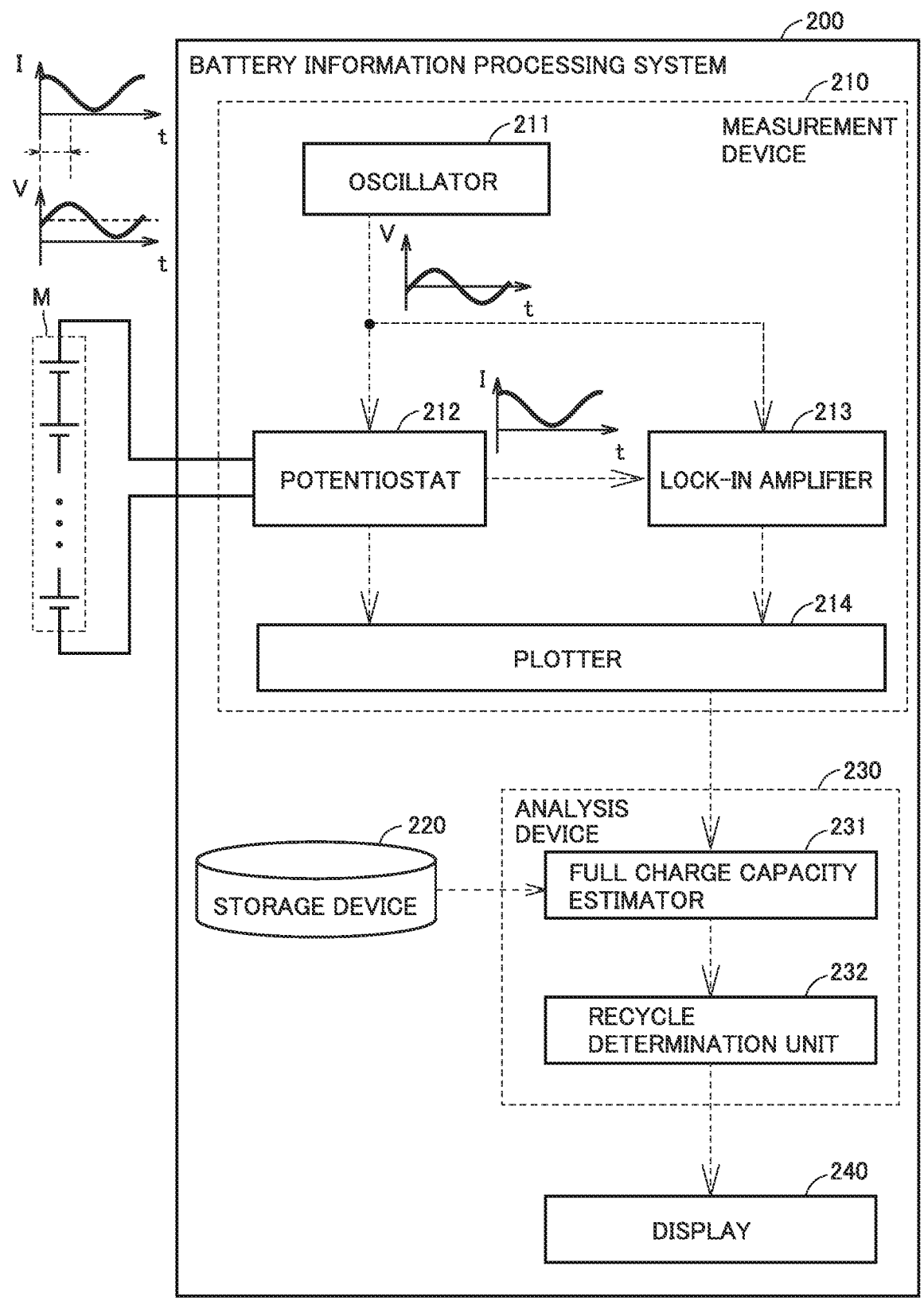
FIG. 4 is a diagram showing a configuration of a battery information system.

FIG. 4 is a diagram showing a configuration of processing system 200.

Processing system 200 includes a measurement device 210, a storage 220, an analysis device 230, and a display 240. These devices may be configured as devices independent of one another or as a single device.

Measurement device 210 measures an AC impedance of module M and outputs a Nyquist plot representing a result of measurement to analysis device 230. More specifically, measurement device 210 includes an oscillator 211, a potentiostat 212, a lock-in amplifier 213, and a plotter 214.

Oscillator 211 outputs sinusoidal waves identical in phase to potentiostat 212 and lock-in amplifier 213.

Potentiostat 212 generates an application signal by superimposing a prescribed direct-current (DC) voltage on an AC voltage (for example, a voltage at an amplitude around 10 mV) identical in phase to sinusoidal waves from oscillator 211 and applies the generated application signal to module M. Then, potentiostat 212 detects a current which flows through module M and outputs a result of detection to lock-in amplifier 213 as a response signal from module M. Potentiostat 212 outputs the application signal and the response signal to plotter 214.

Lock-in amplifier 213 compares a phase of the sinusoidal waves received from oscillator 211 with a phase of the response signal detected by potentiostat 212 and outputs a result of comparison (a phase difference between the sinusoidal waves and the response signal) to plotter 214.

Plotter 214 plots a result of measurement of an AC impedance of module M on a complex plane based on a signal from potentiostat 212 (a signal indicating an amplitude ratio between the application signal and the response signal) and a signal from lock-in amplifier 213 (a signal indicating a phase difference between the application signal and the response signal). More specifically, a frequency of sinusoidal waves output from oscillator 211 is swept in a prescribed frequency range and processing described previously is repeatedly performed by potentiostat 212 and lock-in amplifier 213. Thus, results of measurement of an AC impedance of module M for each frequency of sinusoidal waves are plotted on the complex plane. This plot is called a "Nyquist plot" (which may also be called a Cole-Cole plot). The Nyquist plot of module M is output to analysis device 230.

The configuration of measurement device 210 is not limited to the configuration shown in FIG. 4. For example, though description that an AC voltage is applied to module M and a current which flows through module M at that time is detected has been given, potentiostat 212 may detect a voltage response at the time of application of an AC current to module M. Measurement device 210 may include a frequency response analyzer (not shown) instead of lock-in amplifier 213.

An approach below can also be adopted as an approach to measurement of an AC impedance. Specifically, an application signal (one of a voltage signal and a current signal) including various frequency components within a prescribed frequency range is generated, and a response signal (the other of the voltage signal and the current signal) at the time of application of the application signal is detected. Each of the application signal and the response signal is subjected to fast Fourier transform (FFT) for frequency decomposition, to thereby calculate an AC impedance for each frequency.

A Nyquist plot can be created also by such an approach.

Storage 220 stores a trained (learned) neural network model for estimation of a full charge capacity of a module by analysis device 230. Storage 220 trains the neural network model, updates a result of training, and outputs the result of training to analysis device 230 by being referred to by analysis device 230 in response to a request from analysis device 230.

Analysis device 230 is implemented, for example, by a microcomputer including a central processing unit (CPU), a memory, and an input/output port (none of which is shown). Specifically, analysis device 230 includes a full charge capacity estimator 231 and a recycle determination unit 232.

Full charge capacity estimator 231 estimates a full charge capacity of module M by analyzing a Nyquist plot of module M obtained by measurement device 210. This processing is referred to as "capacity estimation processing" below. Capacity estimation processing by analysis device 230 will be described in detail later.

Recycle determination unit 232 determines a manner of recycle of module M based on a result of estimation of the full charge capacity of module M. Recycle determination unit 232 may determine whether or not module M is recyclable. The full charge capacity of module M estimated by analysis device 230 and the manner of recycle determined by recycle determination unit 232 are output to display 240.

Display 240 is implemented, for example, by a liquid crystal display and shows a result of capacity estimation processing and a result of determination of the manner of recycle of module M by analysis device 230. The test service provider can thus know how module M should be processed.

Analysis device 230 corresponds to the "estimation device" according to the present disclosure. Recycle determination unit 232 is not a feature essential for estimation of a full charge capacity of module M in analysis device 230. Storage 220 and analysis device 230 correspond to the "battery information system" according to the present disclosure.

<Nyquist Plot>

Figure 5:
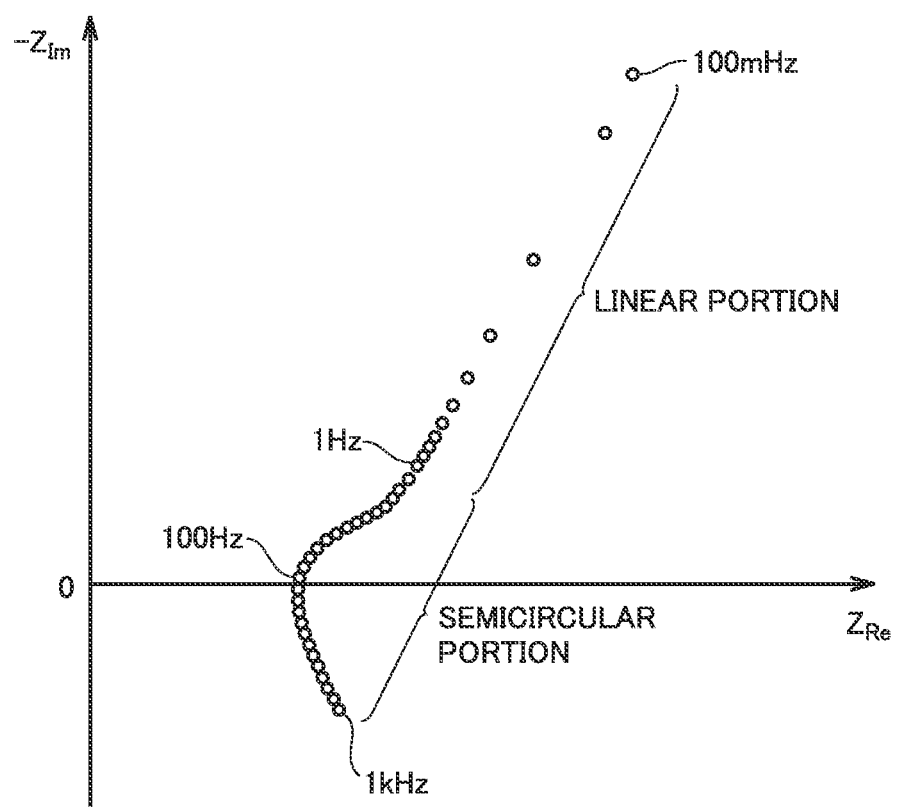
FIG. 5 is a diagram showing one example of a Nyquist plot of a result of measurement of an AC impedance of a module.
Figure 9:
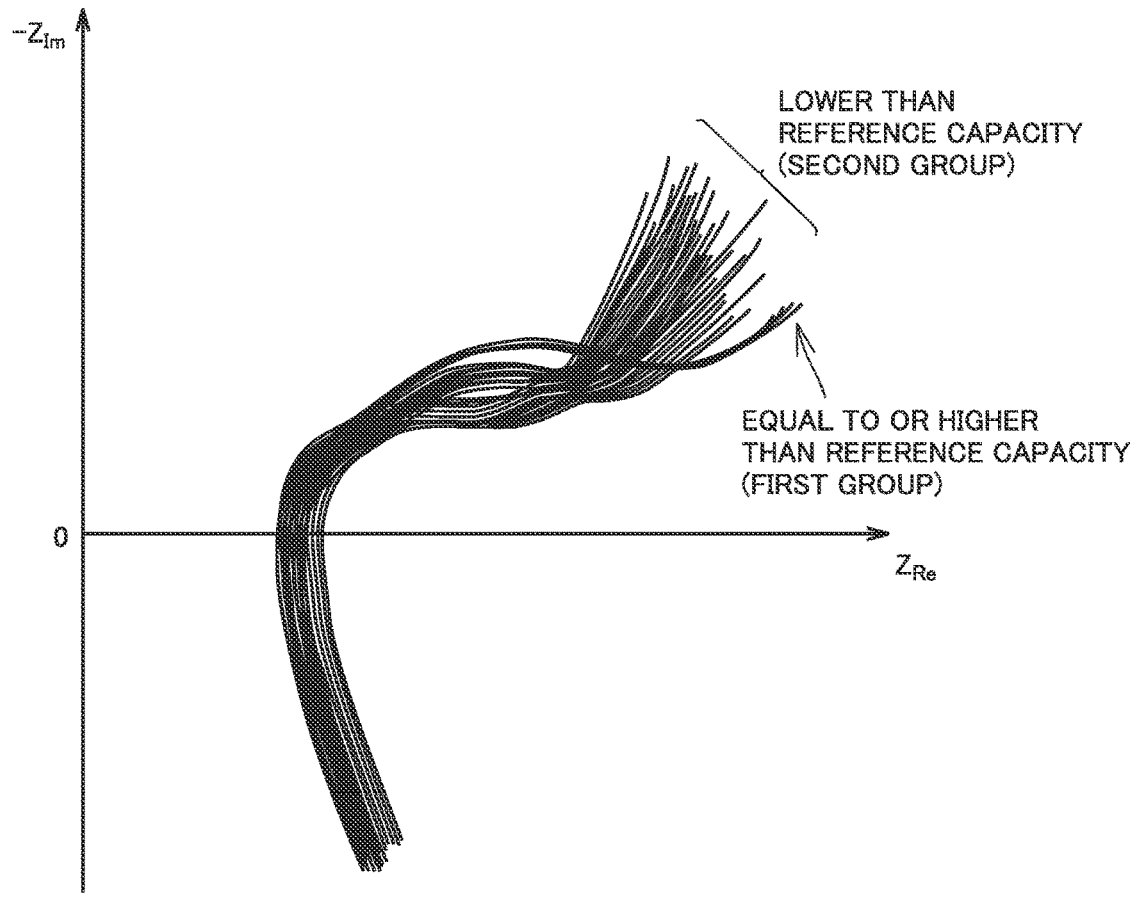
FIG. 9 is a diagram showing relation between a result of measurement in a Nyquist plot and a full charge capacity.

FIG. 5 is a diagram showing one example of a Nyquist plot of a result of measurement of an AC impedance of module M. In FIG. 5 and FIG. 9 which will be described later, the abscissa represents a real number component $Z_{Re}$ of a complex impedance of module M and the ordinate represents an imaginary number component $-Z_{Im}$ of the complex impedance of module M.

FIG. 5 shows one example of a result of measurement of an AC impedance when a frequency of an application signal is swept within a range from 100 mHz to 1 kHz. As shown in FIG. 5, as a result of application of signals at various frequencies, results of measurement of the AC impedance of module M in accordance with the frequencies are plotted on the complex plane as discrete values. More specifically, in the present embodiment, application signals at 52 frequencies in a frequency region from 100 mHz to 1 kHz are employed. The Nyquist plot thus obtained includes a semicircular portion obtained from an application signal at a high frequency (1 Hz to 1 kHz in this example) and a linear portion obtained from an application signal at a low frequency (100 mHz to 1 Hz).

In capacity estimation processing in the present embodiment, a neural network model is used for estimating a full charge capacity of a module. In this neural network model, machine learning by a neural network model is done so as to output a highly accurate result of estimation of a full charge capacity from an output layer when a result of measurement of the AC impedance is given to the input layer. In order to clarify a characteristic of training of the neural network model in the present embodiment, initially, training in a comparative example will be described. <Comparative Example>

Figure 6:
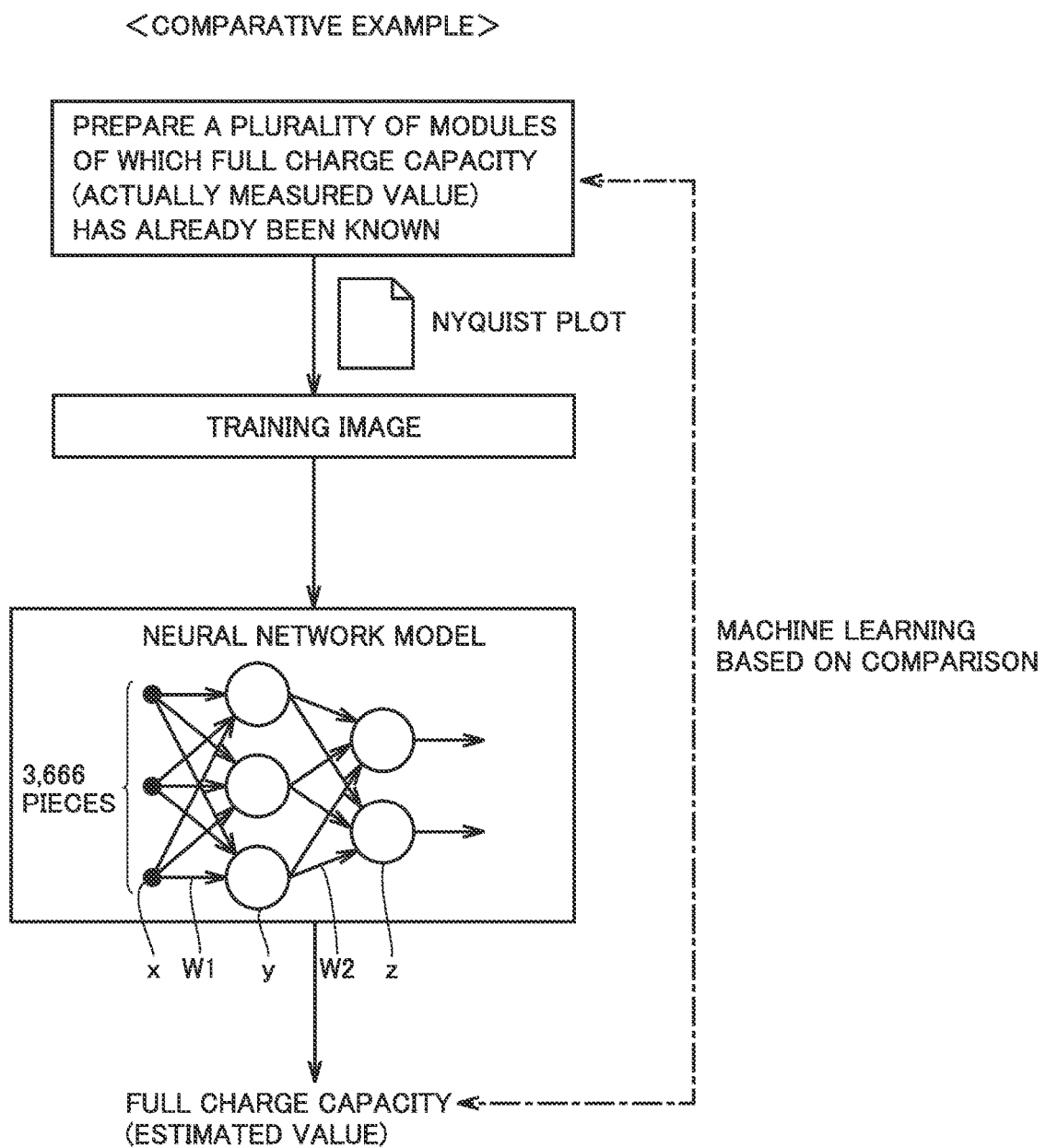
FIG. 6 is a conceptual diagram for illustrating training of a neural network model in a comparative example.

FIG. 6 is a conceptual diagram for illustrating training of a neural network in a comparative example. Referring to FIG. 6, a neural network model includes, for example, an input layer x, a hidden layer y, and an output layer z. A weight between input layer x and the hidden layer is denoted as W1 and a weight between hidden layer y and output layer z is denoted as W2.

In each of the comparative example and the present embodiment, initially, a plurality of (a large number of) modules of which full charge capacity has already been known are prepared. An image to be used for machine learning is generated based on results of measurement of the AC impedance of those modules (Nyquist plot). This image is referred to as a "training image." The training image is generated for each result of measurement of the AC impedance. When the AC impedance of m modules is measured, m training images are generated. An estimated value of the full charge capacity is output from output layer z of the neural network model each time a plurality of training images are successively given to input layer x of the neural network model. Then, based on comparison between the already known value (an accurate value) of the full charge capacity and the estimated value of the full charge capacity, machine learning (supervised learning) by the neural network model proceeds.

Figure 7:
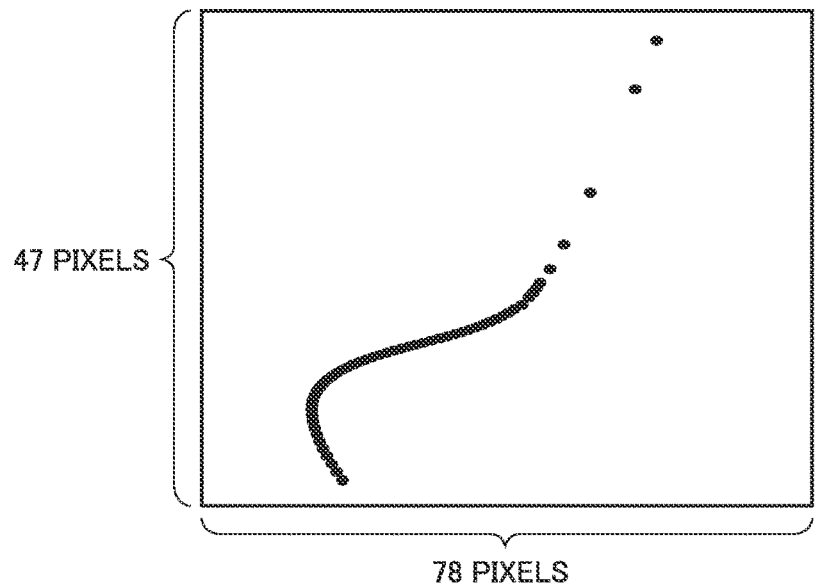
FIG. 7 is a diagram for illustrating a training image.

FIG. 7 is a diagram for illustrating a training image. The training image is made up, for example, of a region of vertical 47 pixels x horizontal 78 pixels=3,666 pixels as shown in FIG. 7. In the training image, a pixel which matches with any of results of measurement of the AC impedance (Nyquist plot) at 52 frequencies is black-colored and a pixel which matches with none of them is white-colored. By doing so, 3,666 pieces of input information can be obtained from the results of measurement of the AC impedance at 52 frequencies. Since the training image contains not only information represented by the pixels which match with the Nyquist plot (information shown with black) but also information represented by the pixels which do not match with the Nyquist plot (information shown as a margin), an amount of input information is large. Thus, as compared with an example in which results of measurement of the AC impedance at 52 frequencies are simply given to input layer x of the neural network model, an effect of learning can be enhanced and hence accuracy in estimation of the full charge capacity can be improved.

Input layer x of the neural network model includes 3,666 nodes in correspondence with 3,666 pieces of input information. Output layer z can include 71 nodes so as to be able to output results of estimation of the full charge capacity in increments of 0.1 Ah within a range from 0 Ah to 7 Ah.

Figure 8:
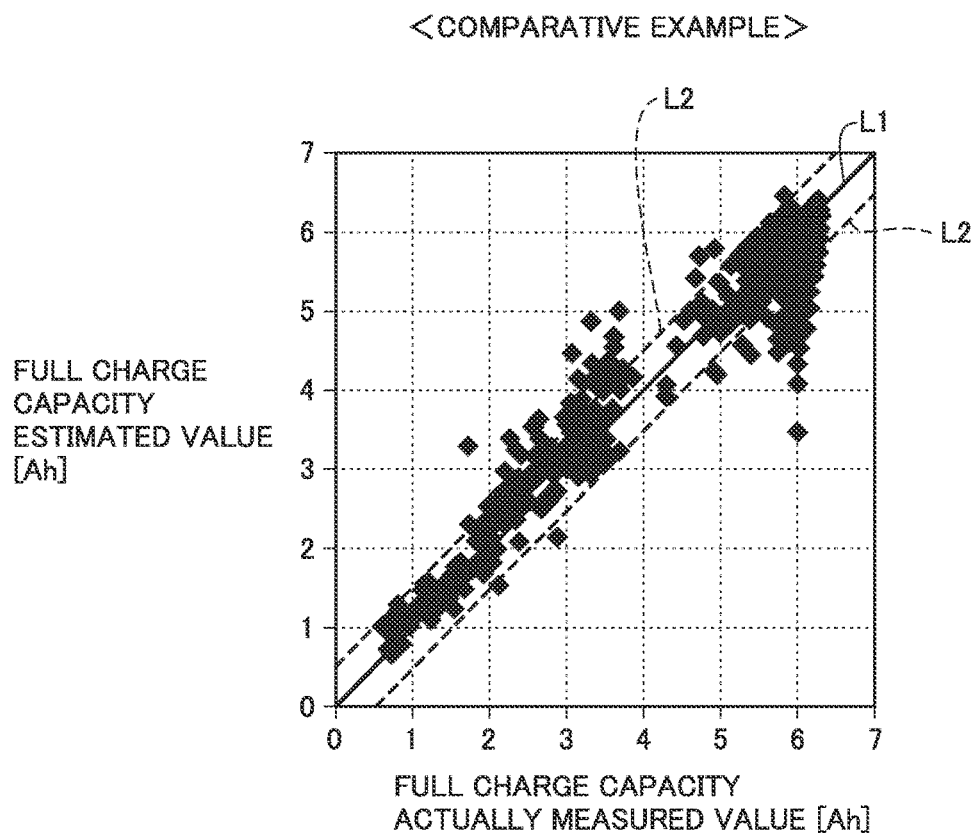
FIG. 8 is a diagram for illustrating one example of a result of estimation of a capacity of a module in the comparative example.
Figure 14:
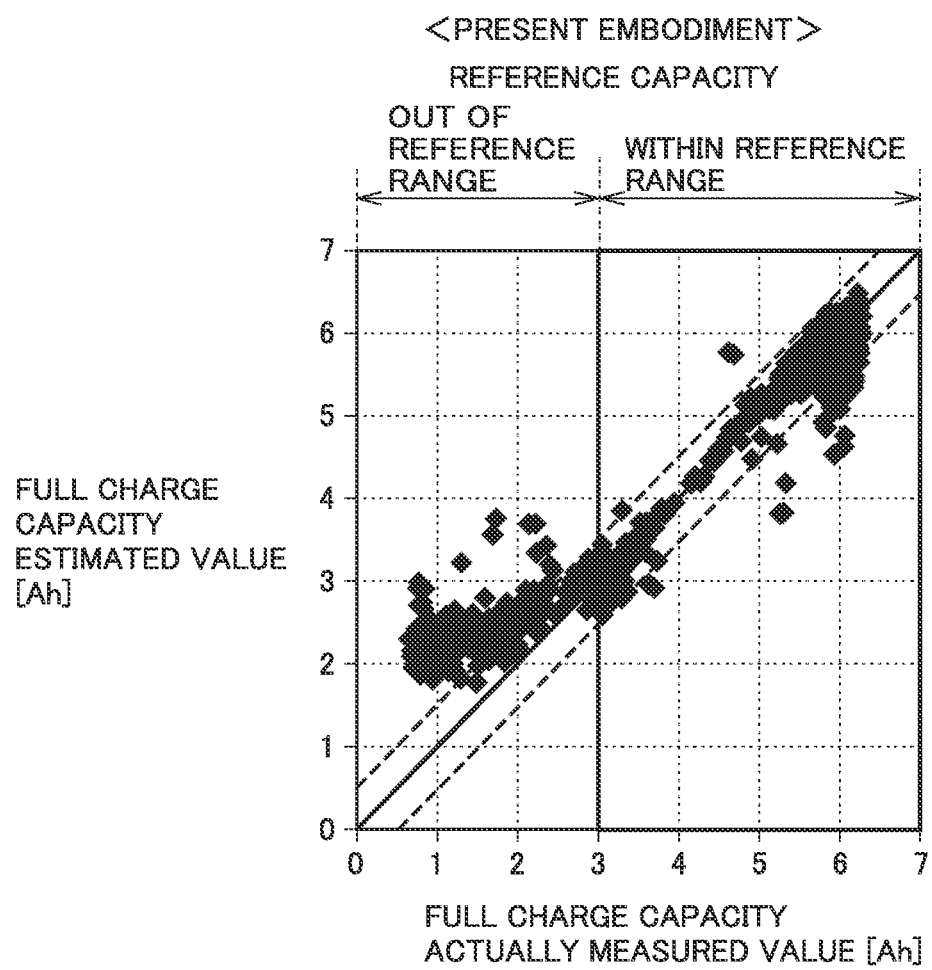
FIG. 14 is a diagram for illustrating one example of a result of estimation of a capacity of a module in the present embodiment.

FIG. 8 is a diagram for illustrating one example of a result of estimation of a capacity of a module in the comparative example. In FIG. 8 and FIG. 14 which will be described later, the abscissa represents an actual full charge capacity of the module. The actual full charge capacity refers, for example, to a full charge capacity measured with a measurement approach generally regarded as highly accurate, although it requires time for measurement, such as measurement of an amount of charging in charging of a module from a completely discharged state to a fully charged state. This value is also denoted below as an "actually measured value of the full charge capacity." The ordinate represents a full charge capacity of a module calculated in accordance with the previously-described capacity estimation processing in Comparative Example 1. This value is also denoted below as an "estimated value of the full charge capacity."

FIGS. 8 and 14 each show with a straight line L1 (a solid line), a state that the estimated value of the full charge capacity and the actually measured value of the full charge capacity exactly match with each other. A state that an error between the estimated value of the full charge capacity and the actually measured value of the full charge capacity is within a prescribed range (±0.5 Ah in this example) is shown as a range lying between two straight lines L2 (dashed lines) (which is denoted as a "matching range"). A ratio of the estimated value of the full charge capacity being within the matching range as a result of estimation of the full charge capacity of a large number of modules by capacity estimation processing is herein called "capacity estimation accuracy."

Referring to FIG. 8, capacity estimation accuracy in the comparative example was 83.0%. Though this capacity estimation accuracy is not low, capacity estimation accuracy is desirably further improved.

Training of the neural network model in the comparative example is performed by using training images generated from modules various in full charge capacity. In contrast, the inventors have found based on a result of observation of Nyquist plots that a shape of a linear portion (see FIG. 5) of a Nyquist plot exhibits a tendency different between an example in which a full charge capacity is within one range and an example in which the full charge capacity is out of the range. This range of the full charge capacity is referred to as a "reference range" below and a lower limit value of the reference range is referred to as a "reference capacity." In this example, the reference range refers to a range not lower than 3 Ah and not higher than 7 Ah and the reference capacity is defined as 3 Ah.

FIG. 9 is a diagram showing relation between a shape of a Nyquist plot and a full charge capacity. FIG. 9 shows Nyquist plots of modules various in full charge capacity as being superimposed on one another. Referring to FIG. 9, it can be seen that an end portion of the linear portion is located on a lower side in the Nyquist plot obtained from a module of which full charge capacity is within the reference range (not lower than 3 Ah representing the reference capacity), that is, an imaginary number component of the AC impedance is smaller, than in the Nyquist plot obtained from a module of which full charge capacity is out of the reference range (lower than 3 Ah). It can be seen that a slope of the linear portion is small (an inclination of the linear portion is gentle).

More specifically, in a Nyquist plot of a module of which full charge capacity is not lower than the reference capacity, an imaginary number component of the AC impedance at 100 mHz lowest in frequency in the linear portion is smaller and the slope of the linear portion in the range from 100 mHz to 120 mHz is smaller than in a Nyquist plot of a module of which full charge capacity is lower than the reference capacity. It can thus be seen that, when there is a module of which full charge capacity is not known, whether or not the full charge capacity of that module is equal to or higher than the reference capacity can be determined by extracting an imaginary number component of the AC impedance at the end portion of the linear portion and the slope of the linear portion from the Nyquist plot of that module.

In addition to the finding above, when the full charge capacity of a certain module is lower than the reference capacity (3 Ah in this example), that module is concluded as having excessively deteriorated and not being suitable for rebuild.

Therefore, the circumstances are that the module is desirably resource-recycled (collection of resources), and in that case, there is little need to find a more specific value of the full charge capacity.

In view of such findings and circumstances, in the present embodiment, initially, module M of which full charge capacity is to be estimated is subjected to two-group discriminant analysis. Specifically, whether or not the full charge capacity of module M is equal to or higher than the reference capacity is initially checked by extracting two feature values (an imaginary number component of the AC impedance at the end portion of the linear portion and a slope of the linear portion) from the Nyquist plot of module M. When the full charge capacity is consequently equal to or higher than the reference capacity, a more specific full charge capacity is estimated by using a neural network model.

The neural network model to be used has finished machine learning by using training images generated from Nyquist plots of modules of which full charge capacity is equal to or higher than the reference capacity. Therefore, it has been optimized for estimation of the full charge capacity of the module of which full charge capacity is equal to or higher than the reference capacity. Therefore, as compared with an example in which training images generated from Nyquist plots of all modules are used for machine learning without taking into account whether the full charge capacity is equal to or higher than the reference capacity, accuracy in estimation of the full charge capacity can be improved (in other words, a training image generated from a Nyquist plot of a module to be resource-recycled of which full charge capacity is lower than the reference capacity is also used for machine learning).

<Two-Group Discriminant Analysis>

In the present embodiment, the Maharanobis-Taguchi system (MT system) is used as an approach to two-group discriminant analysis. This approach will briefly be described. In the following, a module of which full charge capacity is equal to or higher than the reference capacity is referred to as belonging to a "first group" and a module of which full charge capacity is lower than the reference capacity is referred to as belonging to a "second group."

Figure 10:
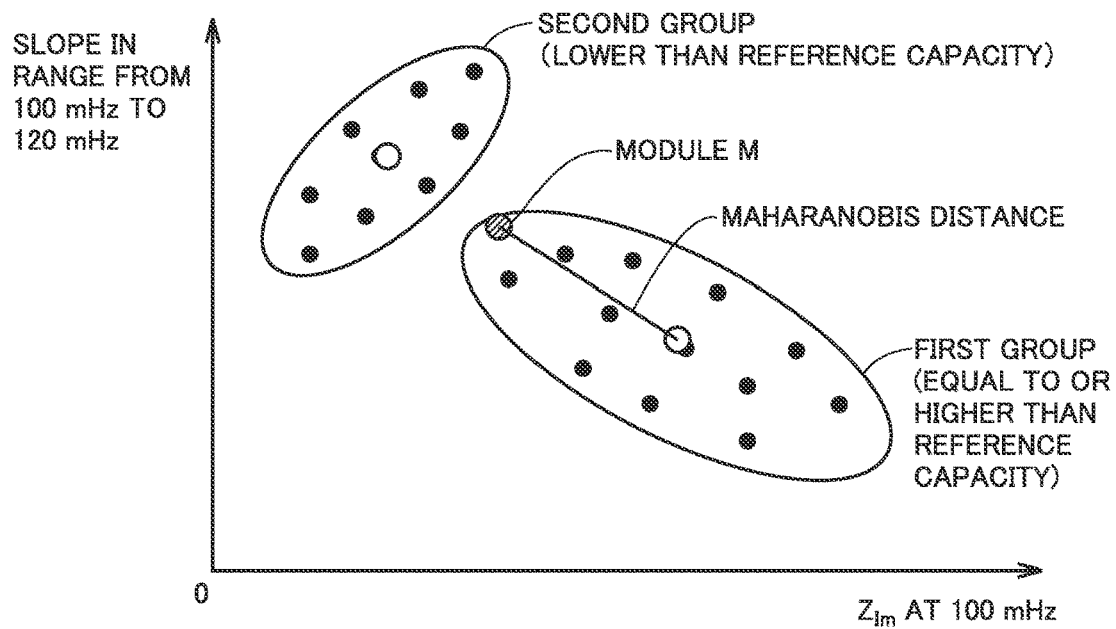
FIG. 10 is a diagram for illustrating discriminant analysis in the present embodiment.

FIG. 10 is a conceptual diagram for illustrating an approach to two-group discriminant analysis in the present embodiment. In FIG. 10, the abscissa represents an imaginary number component of an AC impedance at the end portion of the linear portion of a Nyquist plot (a frequency of an application signal=100 mHz) and the ordinate represents a slope of the linear portion in a range of frequencies of the application signal from 100 mHz to 120 mHz.

Nyquist plots and full charge capacities (actually measured values) of a plurality of modules are prepared. FIG. 10 shows plotted results of extraction of the imaginary number components of the AC impedances at the end portions of the linear portions and the slopes of the linear portions from the Nyquist plots as feature values (explanatory variables) (see black circles). Each plot (black circle) is further discriminated based on whether or not the full charge capacity (actually measured value) is equal to or higher than the reference capacity. A plot group (unit space) obtained from modules of which full charge capacity (actually measured value) is equal to or higher than the reference capacity is shown as the "first group" and a plot group (signal space) obtained from modules of which full charge capacity is lower than the reference capacity is shown as the "second group."

In determining to which of the first group and the second group module M of which full charge capacity is unknown and to be estimated belongs (whether or not the full charge capacity of module M is equal to or higher than the reference capacity), initially, a Maharanobis distance of a plot representing module M from the plot group representing the first group is calculated based on the two feature values extracted from the Nyquist plot of module M.

The Maharanobis distance in this example conceptually refers to a distance between the plot representing module M and the plot group representing the first group (which even takes into consideration how plots are scattered). In FIG. 10, the Maharanobis distance is expressed as a distance between a plot representing module M (see a hatched point) and a plot (see a white circle) located in the inside of the plot group representing the first group (around the center). Specifically, a Maharanobis distance d in the present embodiment can be calculated in accordance with an expression (1) below:

$$d = \sqrt{\frac{\frac{(x_1-\mu_1)^2}{\sigma_1^2} - \frac{2\rho(x_1-\mu_1)(x_2-\mu_2)}{\sigma_1\sigma_2} + \frac{(x_2-\mu_2)^2}{\sigma_2^2}}{1-\rho^2}} \quad (1)$$

where $x_1$ represents an imaginary number component of the AC impedance at the end portion of the linear portion of the Nyquist plot of module M, $x_2$ represents a slope of the linear portion of the Nyquist plot of module M, $\mu_1$ represents an average value of imaginary number components of the AC impedances at the end portions of the linear portions of the Nyquist plots of the modules belonging to the first group, $\mu_2$ represents an average value of slopes of the linear portions of the Nyquist plots of the modules belonging to the first group, and p represents a correlation coefficient expressed as $p=\sigma_{12}/\sigma_1\sigma_2$ by using variance $\sigma_1$, $\sigma_2$ and covariance $\sigma_{12}$ of data of the modules belonging to the first group.

When Maharanobis distance d is equal to or shorter than a predetermined threshold value TH, module M is determined as belonging to the first group. When the Maharanobis distance is longer than threshold value TH, module M is determined as belonging to the second group.

Module M may be discriminated by separately calculating a Maharanobis distance between module M and the first group and a Maharanobis distance between module M and the second group, comparing the Maharanobis distances with each other, and determining to which of the first group and the second group module M is closer. The approach to two-group discriminant analysis is not limited to the Maharanobis-Taguchi system, and another approach may be employed. For example, a linear discriminant method by extracting a feature value different from the two feature values may be employed.

<Neural Network Training>

Figure 11:
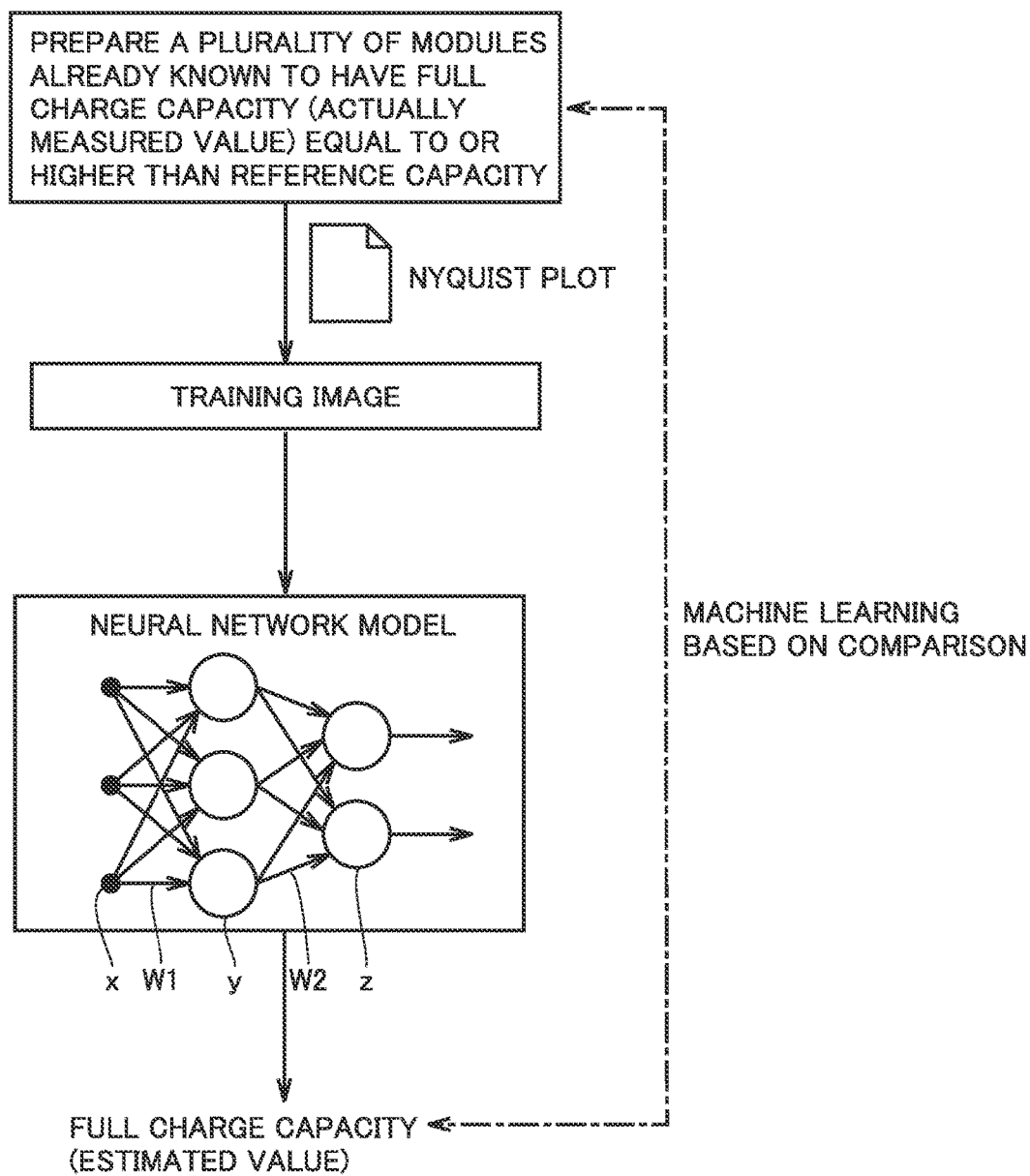
FIG. 11 is a conceptual diagram for illustrating training of a neural network model in the present embodiment.
Figure 12:
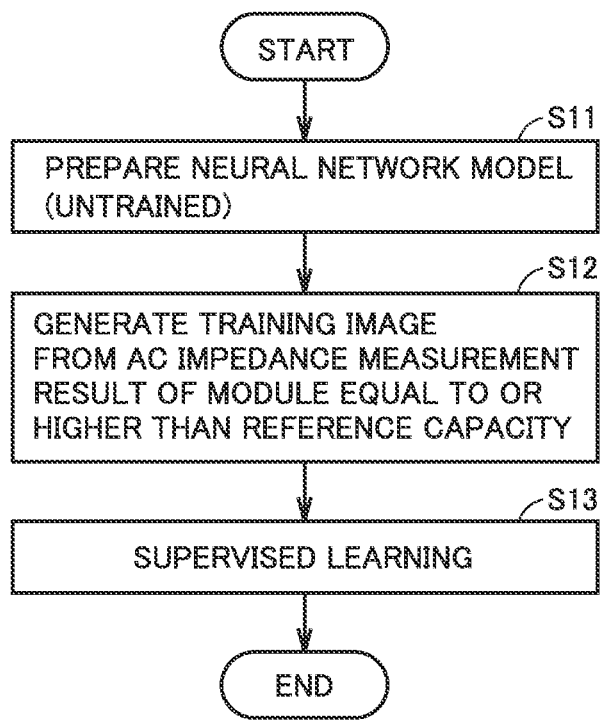
FIG. 12 is a flowchart showing a method of training a neural network model in the present embodiment.

FIG. 11 is a conceptual diagram for illustrating training of a neural network model in the present embodiment. FIG. 12 is a flowchart showing a method of training a neural network model in the present embodiment. The flowchart is executed when a condition determined by a developer of a neural network model is satisfied.

Referring to FIGS. 11 and 12, initially, a plurality of modules of which actually measured value of the full charge capacity is equal to or higher than the reference capacity (3 Ah in this example) are prepared. An untrained neural network model is prepared (S11).

In S12, training images as many as results of measurement of the AC impedance (Nyquist plots) of the plurality of modules of which full charge capacity is equal to or higher than the reference capacity are generated. Since this processing has been described in detail with reference to FIG. 6, description will not be repeated.

In S13, any of the training images generated in S12 is given to input layer x of the neural network model and an output (an estimated value of the full charge capacity) from input layer x is obtained. Supervised learning by the neural network model is thus performed. More specifically, training is performed in a procedure as below.

Initially, whether or not an estimated value of the full charge capacity is correct is determined based on comparison between the estimated value of the full charge capacity and the actually measured value of the full charge capacity and whether or not the estimated value is correct is fed back as a teaching signal. For example, it is assumed that the full charge capacity of a certain module is estimated as Qk from the training image of the module. When the actually measured value of the full charge capacity of that module is Qk, the teaching signal indicating that estimation was correct is fed back. On the other hand, when the actually measured value of the full charge capacity of that module is not Qk, the fact that estimation is incorrect is fed back as a teaching signal. In accordance with the teaching signal based on results of estimation of a large number of modules, weight W1 between input layer x and hidden layer y and weight W2 between hidden layer y and output layer z are adjusted. By thus repeating correction by the teaching signal while estimation using a large number of training images is being made, capacity estimation accuracy of the neural network model is enhanced. When capacity estimation accuracy is higher than a prescribed value or a prescribed time period has elapsed, processing in S13 ends. Training of the neural network model is thus completed.

<Flow in Capacity Estimation Processing>

Figure 13:
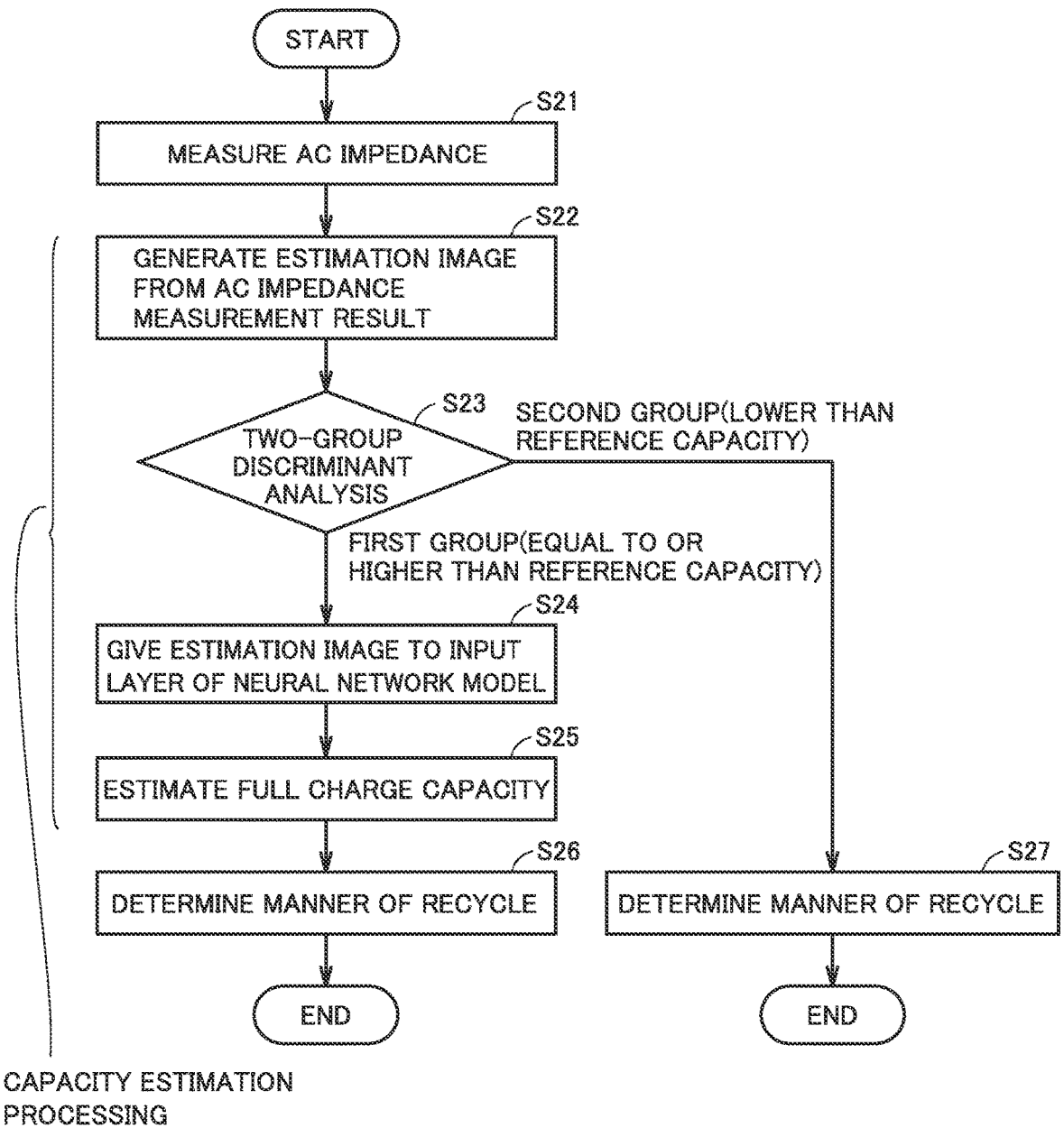
FIG. 13 is a flowchart showing processing for estimating a capacity of a module in the present embodiment.

FIG. 13 is a flowchart showing processing for estimating a capacity of module M in the present embodiment. This flowchart is executed by processing system 200, for example, when the test service provider sets module M in processing system 200 and operates a not-shown operation portion (such as a start button).

For the sake of brevity of description, components (such as each constituent element included in measurement device 210 or analysis device 230) of processing system 200 as an entity to perform each type of processing are not particularly distinguished below and they are comprehensively denoted as "processing system 200." Though each step is basically performed by software processing by processing system 200, it may partly or entirely be performed by hardware (an electric circuit) provided in processing system 200.

Referring to FIG. 13, processing system 200 initially measures an AC impedance of module M and obtains a Nyquist plot from a result of measurement (S21). Since the approach to measurement of an AC impedance has been described in detail in description of the configuration of measurement device 210 with reference to FIG. 4, description will not be repeated.

Then, processing system 200 generates an image for estimating the full charge capacity of module M (which is denoted as an "estimation image" below) from a result of measurement of the AC impedance of module M (S22). An approach to generation of an estimation image is similar to the approach to generation of a training image described with reference to FIG. 7.

In S23, processing system 200 performs two-group discriminant analysis for determining to which of the first group and the second group module M belongs based on an estimation image for module M. Since the two-group discriminant approach has also been described in detail with reference to FIG. 9, description will not be repeated.

When module M is determined as belonging to the first group as a result of two-group discriminant analysis (the first group in S23), processing system 200 gives the estimation image for module M generated in S22 to input layer x of the neural network model (S24). Then, processing system 200 receives an estimated value of the full charge capacity of module M from output layer z of the neural network model (S25).

In S26, processing system 200 determines a manner of recycle of module M based on the estimated value of the full charge capacity of module M. For example, processing system 200 calculates a ratio (=Q(M)/Q0) between a current full charge capacity Q(M) representing the estimated value of the full charge capacity of module M and an initial full charge capacity Q0 (a value already known based on specifications of module M) as a "capacity retention," and compares the capacity retention with a prescribed criterion value. When the capacity retention of module M is equal to or higher than the criterion value, processing system 200 determines that module M can be used for rebuilding a battery assembly, and when the capacity retention of module M is lower than the criterion value, it determines that module M cannot be used for rebuild (should be resource-recycled).

When module M is determined as belonging to the second group as a result of two-group discriminant analysis (the second group in S23), processing system 200 determines a manner of recycle of module M without using the neural network model (S27). More specifically, processing system 200 determines module M as not being suitable for rebuild and determines module M to be resource-recycled because the full charge capacity of module M is lower than the reference capacity.

<Result of Evaluation>

FIG. 14 is a diagram for illustrating one example of a result of accuracy in estimation of a capacity of a module in the present embodiment and compared with FIG. 8. Referring to FIG. 14, in a region where the full charge capacity is equal to or higher than 3 Ah representing the reference capacity (shown as being surrounded by a bold line), a sufficiently high ratio of plots located in the matching range among plots of combination of the estimated value and the actually measured value of the full charge capacity can be seen. Specifically, capacity estimation accuracy in the region where the full charge capacity is equal to or higher than the reference capacity was 86.2%. This value is higher than capacity estimation accuracy (83.0%) in the comparative example. It can thus be concluded that improvement in capacity estimation accuracy in the present embodiment is supported.

As set forth above, in the present embodiment, prior to estimation of the full charge capacity of module M, whether module M belongs to the first group defined as a group of modules of which full charge capacity is within the reference range (equal to or higher than the reference capacity) or to the second group defined as a group of modules of which full charge capacity is out of the reference range (lower than the reference capacity) is determined based on two-group discriminant analysis. When module M belongs to the first group, the full charge capacity of module M is specifically estimated by using the trained neural network model. This neural network model has finished machine learning by using a training image generated from the Nyquist plot of the module of which full charge capacity is equal to or higher than the reference capacity (the module belonging to the first group). Therefore, it can be concluded that the neural network model has been optimized for estimation of the full charge capacity of the module belonging to the first group, as compared with a neural network model which has finished machine learning taking into consideration both of a module belonging to the first group and a module belonging to the second group. Therefore, according to the present embodiment, accuracy in estimation of the full charge capacity of module M can be improved. According to the present embodiment, a battery assembly can be manufactured from a module of which full charge capacity has highly accurately been estimated.

An example of optimization of a neural network model for a module of which full charge capacity is equal to or higher than the reference capacity is mainly described in the present embodiment. A neural network model optimized for a module of which full charge capacity is lower than the reference capacity can also be constructed with an approach the same as in the present embodiment.

Two neural network models may be constructed, More specifically, a first neural network model optimized for a module of which full charge capacity is equal to or higher than the reference capacity and a second neural network model optimized for a module of which full charge capacity is lower than the reference capacity may be constructed and one appropriate neural network model may selectively be used in accordance with a result of two-group discriminant analysis.

Though the embodiment of the present disclosure has been described, it should be understood that the embodiment disclosed herein is illustrative and non-restrictive in every respect. The scope of the present disclosure is defined by the terms of the claims and is intended to include any modifications within the scope and meaning equivalent to the terms of the claims.

What is claimed is:

1. A battery information processing system comprising:
   a storage configured to store a trained neural network model; and
   an estimation device configured to estimate a full charge capacity of a target secondary battery from a Nyquist plot showing a result of measurement of an AC impedance of the target secondary battery by using the trained neural network model,
   the trained neural network model being a neural network model which has been trained based on Nyquist plots of a plurality of secondary batteries of which full charge capacity is within a reference range,
   the estimation device being configured to
      determine to which of a first group and a second group the target secondary battery belongs based on discriminant analysis, the discriminant analysis adopting at least one feature value extracted from the Nyquist plot of the target secondary battery as an explanatory variable, the first group being defined as a group of secondary batteries of which full charge capacity is within the reference range, the second group being defined as a group of secondary batteries of which full charge capacity is out of the reference range, and
      estimate a full charge capacity of the target secondary battery by using the trained neural network model when the estimation device determines that the target secondary battery belongs to the first group.

2. The battery information processing system according to claim 1, wherein
   the trained neural network model is a neural network model which has been trained based on Nyquist plots of a plurality of secondary batteries of which full charge capacity is higher than a reference capacity representing a lower limit value of the reference range,
   the first group is defined as a group of secondary batteries of which full charge capacity is higher than the reference capacity, and the second group is defined as a group of secondary batteries of which full charge capacity is lower than the reference capacity.

3. The battery information processing system according to claim 1, wherein the at least one feature value includes an imaginary number component of an AC impedance at a prescribed frequency included in a linear portion, of a semicircular portion and the linear portion of the Nyquist plot of the target secondary battery, and a slope of the linear portion.

4. The battery information processing system according to claim 1, wherein the trained neural network model includes an input layer given a numeric value for each pixel of an image in which the Nyquist plot of the secondary battery is drawn in a region consisting of a predetermined number of pixels, and the predetermined number of pixels is greater than a sum of the number of real number components and the number of imaginary number components both representing the result of measurement of the AC impedance of the secondary battery.

5. The battery information processing system according to claim 1, wherein the Nyquist plot of the target secondary battery includes a result of measurement of the AC impedance when a frequency of an applied AC signal is within a frequency range not lower than 100 mHz and not higher than 1 kHz.

6. A battery assembly comprising:

a plurality of the secondary batteries of which full charge capacity has been estimated by the battery information processing system according to claim 1.

7. A secondary battery full charge capacity estimation method of estimating a full charge capacity of a target secondary battery comprising:

obtaining a result of measurement of an AC impedance of the target secondary battery; and estimating a full charge capacity of the target secondary battery from a Nyquist plot showing the result of measurement of the AC impedance of the target secondary battery by using a trained neural network model, the trained neural network model being a neural network model which has been trained based on Nyquist plots of a plurality of secondary batteries of which full charge capacity is within a reference range;

determining to which of a first group and a second group the target secondary battery belongs based on discriminant analysis, the discriminant analysis adopting a feature value extracted from the Nyquist plot of the target secondary battery as an explanatory variable, the first group being defined as a group of secondary batteries of which full charge capacity is within the reference range, the second group being defined as a group of secondary batteries of which full charge capacity is out of the reference range; and estimating a full charge capacity of the target secondary battery by using the trained neural network model when it is determined that the target secondary battery belongs to the first group.

8. A method of manufacturing a battery assembly comprising:

obtaining a result of measurement of an AC impedance of a target secondary battery;

estimating a full charge capacity of the target secondary battery from a Nyquist plot showing the result of measurement of the AC impedance of the target secondary battery by using a trained neural network model, the trained neural network model being a neural network model which has been trained based on Nyquist plots of a plurality of secondary batteries of which full charge capacity is within a reference range;

determining to which of a first group and a second group the target secondary battery belongs based on discriminant analysis, the discriminant analysis adopting a feature value extracted from the Nyquist plot of the target secondary battery as an explanatory variable, the first group being defined as a group of secondary batteries of which full charge capacity is within the reference range, the second group being defined as a group of secondary batteries of which full charge capacity is out of the reference range;

estimating a full charge capacity of the target secondary battery by using the trained neural network model when it is determined that the target secondary battery belongs to the first group; and manufacturing a battery assembly from a plurality of the target secondary batteries of which full charge capacity has been estimated in the estimating a full charge capacity.

* * * * *